United States Patent
Toyoda

(10) Patent No.: US 9,705,488 B2
(45) Date of Patent: Jul. 11, 2017

(54) SEMICONDUCTOR DEVICE

(71) Applicant: FUJI ELECTRIC CO., LTD., Kawasaki-shi (JP)

(72) Inventor: Yoshiaki Toyoda, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/812,455

(22) Filed: Jul. 29, 2015

(65) Prior Publication Data
US 2015/0333748 A1    Nov. 19, 2015

Related U.S. Application Data

(63) Continuation of application No. PCT/JP2014/055084, filed on Feb. 28, 2014.

(30) Foreign Application Priority Data

Mar. 1, 2013    (JP) .................................. 2013-040340

(51) Int. Cl.
| | | |
|---|---|---|
| H03K 17/16 | (2006.01) |
| H01L 29/78 | (2006.01) |
| H01L 29/08 | (2006.01) |
| H01L 29/423 | (2006.01) |
| H01L 27/06 | (2006.01) |
| H01L 27/092 | (2006.01) |

(Continued)

(52) U.S. Cl.
CPC ....... *H03K 17/161* (2013.01); *H01L 27/0629* (2013.01); *H01L 27/0922* (2013.01); *H01L 29/0847* (2013.01); *H01L 29/4236* (2013.01); *H01L 29/78* (2013.01); *H01L 29/7827* (2013.01); *H01L 27/088* (2013.01); *H01L 27/0883* (2013.01); *H01L 29/0619* (2013.01); *H01L 29/42368* (2013.01); *H01L 29/7811* (2013.01); *H01L 29/7813* (2013.01); *H01L 29/7835* (2013.01); *H01L 29/8613* (2013.01)

(58) Field of Classification Search
CPC .................................................. H03K 17/161
See application file for complete search history.

(56) References Cited

U.S. PATENT DOCUMENTS

| | | | |
|---|---|---|---|
| 5,744,994 A | 4/1998 | Williams | |
| 6,724,175 B1* | 4/2004 | Matsuda | H02M 3/156 323/224 |

(Continued)

FOREIGN PATENT DOCUMENTS

| | | |
|---|---|---|
| JP | 2005-340624 A | 12/2005 |
| JP | 2008-282999 A | 11/2008 |

(Continued)

*Primary Examiner* — Hai L Nguyen
(74) *Attorney, Agent, or Firm* — Rabin & Berdo, P.C.

(57) ABSTRACT

A horizontal MOSFET is arranged in parallel to a horizontal MOSFET and a portion of a return current IL which flows to a linear solenoid flows as a current to the horizontal MOSFET. Therefore, a current which flows to a parasitic transistor is reduced and it is possible to suppress the current which flows to the parasitic transistor provided in the horizontal MOSFET. Since the current which flows to the parasitic transistor is reduced, it is possible to prevent the erroneous operation and breakdown of a semiconductor device forming a synchronous rectification circuit.

14 Claims, 12 Drawing Sheets

(51) Int. Cl.
  *H01L 27/088* (2006.01)
  *H01L 29/06* (2006.01)
  *H01L 29/861* (2006.01)

(56) References Cited

U.S. PATENT DOCUMENTS

| | | |
|---|---|---|
| 2009/0184352 A1 | 7/2009 | Yamaguchi et al. |
| 2010/0001790 A1 | 1/2010 | Hashimoto et al. |
| 2010/0013451 A1* | 1/2010 | Nakamura .......... H02M 3/1588 323/282 |
| 2011/0031952 A1 | 2/2011 | Nakamura |

FOREIGN PATENT DOCUMENTS

| | | |
|---|---|---|
| JP | 2009-065185 A | 3/2009 |
| JP | 2009-124052 A | 6/2009 |
| JP | 2009-170747 A | 7/2009 |
| JP | 2010-016035 A | 1/2010 |
| JP | 2011-205112 A | 10/2011 |
| JP | 2011-254693 A | 12/2011 |
| JP | 4995873 B2 | 8/2012 |

* cited by examiner (a)

(b)

(a)

(b)

(a)

(b)

SEMICONDUCTOR DEVICE

This application is a continuation under 35 U.S.C. 120 of International Application PCT/JP2014/055084 having the International Filing Date of Feb. 28, 2014, and having the benefit of the earlier filing date of Japanese Application No. 2013-040340, filed Mar. 1, 2013. Each of the identified applications is fully incorporated herein by reference.

TECHNICAL FIELD

The present invention relates to a semiconductor device, such as a power integrated circuit (IC), which is used in an in-vehicle linear solenoid driving system and includes a synchronous rectification circuit formed by a vertical MOSFET and a horizontal MOSFET provided on the same semiconductor substrate.

BACKGROUND ART

A synchronous-rectification-type linear solenoid driving system according to the related art will be described with reference to FIGS. 9 and 10. FIG. 9 is a circuit diagram illustrating the synchronous-rectification-type linear solenoid driving system. FIG. 9 illustrates a synchronous rectification circuit that is a switching circuit for driving a linear solenoid which is a load. In the synchronous rectification circuit illustrated in FIG. 9, a vertical n-channel MOSFET 52 which is a high-side switch and a horizontal n-channel MOSFET 53 which is a low-side switch are connected in series to each other between a power supply terminal 57 and a ground terminal 58.

In FIG. 9, reference numeral 54 indicates a body diode (parasitic diode) of the vertical MOSFET 52 and reference numeral 55 indicates a body diode (parasitic diode) of the horizontal MOSFET 53. A linear solenoid 56 is connected as a load to an output terminal 59 which is a connection portion between a source of the vertical MOSFET 52 and a drain of the horizontal MOSFET 53. A control circuit 51 outputs signals to a gate terminal 60 and a gate terminal 61 to control the operation of the vertical MOSFET 52 and the horizontal MOSFET 53. In FIG. 9, reference numeral 62 indicates a ground terminal.

FIG. 10 is a timing chart illustrating the output signals from the control circuit 51. In FIG. 10, the upper waveform is the timing chart of the vertical MOSFET 52 and the lower waveform is the timing chart of the horizontal MOSFET 53.

Next, a synchronous rectification operation when the control circuit 51 outputs the signals illustrated in FIG. 10 in the synchronous-rectification-type linear solenoid driving system illustrated in FIG. 9 will be described. For a period Ton1, the vertical MOSFET 52 is turned on and a current is supplied from the power supply terminal 57 to the linear solenoid 56. When the period Ton1 ends, the vertical MOSFET 52 is turned off and the current which flows to the linear solenoid 56 starts to be reduced. At that time, electromotive force is generated in the linear solenoid 56 in order to keep the current flowing and the potential of the output terminal 59 is lower than the ground potential.

For a period Ton2, the horizontal MOSFET 53 is turned on and a current flows from the ground terminal 58 to the output terminal 59 to supply a return current IL to the linear solenoid 56. The synchronous rectification circuit makes the return current IL flow to the horizontal MOSFET 53 with low resistance to suppress loss. When the horizontal MOSFET 53 is turned on and a channel is opened, the return current IL flows from the source to the drain of the horizontal MOSFET 53 through the channel.

When the vertical MOSFET 52 and the horizontal MOSFET 53 are turned on at the same time, there is a concern that an overcurrent will flow from the power supply terminal 57 to the ground terminal 58 and a defect will occur in the system. Therefore, in the synchronous-rectification-type linear solenoid driving system, during the synchronous rectification operation, a dead time period Td is set between the periods Ton1 and Ton2 to prevent the high-side vertical MOSFET 52 and the low-side horizontal MOSFET 53 from being turned on at the same time. For the period Td, the vertical MOSFET 52 and the horizontal MOSFET 53 are not turned on. Therefore, the return current IL to the linear solenoid 56 is supplied from the ground terminal 58 through the body diode 55 of the horizontal MOSFET 53. The synchronous rectification circuit performs PWM control for changing the duration of the periods Ton1 and Ton2 to change the amount of current supplied, thereby controlling the operation of the linear solenoid 56.

When the high-side switch and the low-side switch of the synchronous rectification circuit are formed by MOSFETs, the following structures are considered: a structure in which two vertical MOSFETs are used; a structure in which two horizontal MOSFETs are used; and a structure in which one vertical MOSFET and one horizontal MOSFET are used.

When two vertical MOSFETs are used, it is necessary to form the two vertical MOSFETs with separate chips in order to connect the vertical MOSFETs in series. In addition, when two vertical MOSFETs are used, in general, a control circuit which is configured by a horizontal MOSFET is formed in a separate chip or it is formed in the same chip together with one of the MOSFET chips.

When two horizontal MOSFETs are used or when one vertical MOSFET and one horizontal MOSFET are used, the MOSFETs can be formed with separate chips, similarly to when two vertical MOSFETs are used, or a so-called power IC can be used in which the MOSFETs and the control circuit are formed in the same chip.

In many cases, the synchronous rectification circuit is used in a DC-DC converter system. In order to reduce the size and costs of the system, a semiconductor device has been proposed in which the chips are accommodated in the same package. For example, the following semiconductor devices have been proposed: a semiconductor device for synchronous rectification which has a one-chip structure using two horizontal MOSFETs; and a semiconductor device for synchronous rectification which has a two-chip structure using a vertical MOSFET and a horizontal MOSFET (for example, see the following Patent Document 1).

In addition, for example, a power IC has been proposed in which a vertical n-channel MOSFET is formed on the high side and a horizontal n-channel MOSFET is formed on the low side, using a portion SOI (for example, see the following Patent Document 2). For example, a power IC has been proposed in which a horizontal n-channel MOSFET is formed on the high side and a vertical n-channel MOSFET is formed on the low side (for example, see the following Patent Document 3). For example, a semiconductor device has been proposed in which a p-channel MOSFET is shunted to suppress the operation of a parasitic diode (for example, see the following Patent Document 4).

CITATION LIST

Patent Document

Patent Document 1: JP 2010-16035 A
Patent Document 2: JP 2005-340624 A

Patent Document 3: JP 2009-170747 A
Patent Document 4: JP 2009-65185 A

When two vertical MOSFETs are used as the high-side switch and the low-side switch of the synchronous rectification circuit, it is possible to reduce the area of the MOSFET chip, as compared to other structures, since the on-resistance of the vertical MOSFET per unit area is generally low. Therefore, the area of the chip is reduced and it is possible to reduce chip costs.

On the other hand, it is necessary to divide a lead frame and connect the chips with wires, in order to provide two vertical MOSFET chips in the same package so as to be connected in series to each other. As a result, a mounting area or the number of assembly processes increases and assembly costs increase. When two horizontal MOSFETs are used, assembly costs do not increase, unlike to the above, but the area of the MOSFET chip increases, which results in an increase in chip costs, since the on-resistance of the horizontal MOSFET per unit area is generally high.

When the vertical MOSFET as a high-side switch and the horizontal MOSFET as a low-side switch are formed in the same chip, the on-resistance of the vertical MOSFET per unit area is reduced and the area of the chip is less than that when two horizontal MOSFETs are used, which results in a reduction in chip costs. In addition, since two MOSFETs are formed in the same chip, it is possible to reduce assembly costs.

Therefore, in terms of the total costs including the chip costs and the assembly costs, it is preferable to use a power IC in which a vertical MOSFET, a horizontal MOSFET, and a control circuit are formed on the same chip, in order to form the synchronous rectification circuit in the same package.

However, the power IC in which the vertical MOSFET, the horizontal MOSFET, and the control circuit are formed on the same chip has the following problems. Next, a synchronous-rectification-type power IC using a vertical MOSFET 52 and a horizontal MOSFET 53 will be described with reference to FIGS. 11 and 12.

FIG. 11 is a diagram illustrating the synchronous-rectification-type power IC using the vertical MOSFET 52 and the horizontal MOSFET 53. FIG. 11(a) is a cross-sectional view illustrating a main portion and FIG. 11(b) is an equivalent circuit diagram. FIG. 12 is a diagram illustrating the I-V characteristics of a parasitic transistor 63.

FIG. 11 illustrates a case in which a trench gate MOSFET is applied to the vertical MOSFET 52 which is a high-side switch and the horizontal MOSFET 53 is applied to a low-side switch. In FIG. 11, an $n^-$ offset diffusion region 8 is formed in the horizontal MOSFET 53 and the horizontal MOSFET 53 is designed so as to have the same breakdown voltage as the vertical MOSFET 52.

In FIG. 11, reference numeral 52 indicates a vertical MOSFET and reference numeral 53 indicates a horizontal MOSFET. Reference numeral 1 indicates a rear surface electrode, reference numeral 2 indicates an $n^+$ substrate, and reference numeral 3 indicates an $n^-$ epitaxial layer. Reference numeral 4a indicates a $p^-$ well diffusion region of the vertical MOSFET 52, reference numeral 4b indicates a $p^-$ well diffusion region of the horizontal MOSFET 53, and reference numeral 5 indicates a p body diffusion region of the vertical MOSFET 52.

In FIG. 11, reference numeral 6a indicates a p contact region which is a $p^+$ diffusion region, reference numeral 7b indicates an n drain region which is an $n^+$ diffusion region of the horizontal MOSFET 53, reference numeral 7c indicates an n source region of the horizontal MOSFET 53, and reference numeral 8 indicates an $n^-$ offset diffusion region of the horizontal MOSFET 53. Reference numeral 10 indicates a gate terminal of the vertical MOSFET 52, reference numeral 11a indicates a gate oxide film of the horizontal MOSFET 53, and reference numeral 12a indicates a gate electrode of the horizontal MOSFET 53. Reference numeral 13a indicates a LOCOS region, reference numeral 14a indicates a metal wire, and reference numeral 51 indicates a control circuit.

In FIG. 11, reference numeral 54 indicates a body diode (vertical MOSFET 52) of the vertical MOSFET 52 and reference numeral 55 indicates a body diode of the horizontal MOSFET 53. Reference numeral 56 indicates a linear solenoid, reference numeral 57 indicates a power supply terminal, and reference numeral 58 indicates a ground terminal. Reference numeral 63 indicates a parasitic transistor of the horizontal MOSFET 53 and reference numeral 66 indicates parasitic resistance.

When the synchronous-rectification-type power IC illustrated in FIG. 11 performs synchronous rectification, a portion of a return current IL flows to the body diode 55 formed by the $p^-$ well diffusion region 4b and the $n^-$ offset diffusion region 8 for a dead time period. At that time, since the $n^-$ epitaxial layer 3, the $p^-$ well diffusion region 4b, and the $n^-$ offset diffusion region 8 form the vertical parasitic transistor 63, the current becomes a base current (current 201) and the parasitic transistor 63 operates. Then, a collector current 202 that is hFE times more than the base current flows from the power supply terminal 57 to the output terminal 59 (see FIG. 12).

Therefore, a large amount of emitter current IE (base current×(1+hFE)), which is the sum of the gate current (current 201) and the collector current 202, flows to the parasitic transistor 63. The large amount of emitter current IE becomes the return current IL for an off period and flows to the linear solenoid 56. The voltage between the collector and emitter of the parasitic transistor 63 is substantially equal to the power supply voltage and a large loss occurs due to the collector current 202. As a result, a semiconductor device 500 is likely to be broken down due to the generation of heat.

Since a current which flows in the vertical direction is not considered in the horizontal MOSFET 53, the collector current 202 is likely to cause an operation error in the semiconductor device 500. Therefore, in the synchronous-rectification-type power IC using the vertical MOSFET 52 and the horizontal MOSFET 53, the problem to be solved is to reduce the current 201 which flows to the parasitic diode (body diode 55) of the horizontal MOSFET 53 and the currents 201 and 202 which flow to the parasitic transistor 64.

The above-mentioned Patent Documents 1 to 4 do not disclose a structure in which the synchronous rectification circuit having the linear solenoid as a load is formed by the vertical MOSFET and the horizontal MOSFET and a method for reducing a current which flows to the parasitic diode (parasitic transistor) of the horizontal MOSFET.

SUMMARY

The invention has been made in order to solve the above-mentioned problems of the related art and an object of the invention is to provide a semiconductor device that can reduce a current which flows to a parasitic transistor provided in a horizontal MOSFET to prevent the erroneous operation or breakdown of a semiconductor device forming a synchronous rectification circuit.

In order to achieve the object, according to an aspect of the invention, a semiconductor device includes: a semiconductor substrate; a first-conductivity-type (a first conductivity type means a first-conductivity-type channel) vertical MOSFET; a first-conductivity-type horizontal MOSFET; a circuit that controls the first-conductivity-type vertical MOSFET and the first-conductivity-type horizontal MOSFET, and a second-conductivity-type (a second conductivity type means a second-conductivity-type channel) horizontal MOSFET. The first-conductivity-type vertical MOSFET, the first-conductivity-type horizontal MOSFET, and the circuit are formed on the semiconductor substrate. A drain of the first-conductivity-type vertical MOSFET is connected to a power supply terminal. A source of the first-conductivity-type horizontal MOSFET is connected to a ground terminal. A source of the first-conductivity-type vertical MOSFET and a drain of the first-conductivity-type horizontal MOSFET are connected to an output terminal to form a synchronous rectification circuit. The second-conductivity-type horizontal MOSFET is connected in parallel to the first-conductivity-type horizontal MOSFET between the output terminal and the ground terminal. A drain of the second-conductivity-type horizontal MOSFET is connected to the source of the first-conductivity-type horizontal MOSFET. A back gate of the second-conductivity-type horizontal MOSFET has a potential that is different from a potential of the source of the first-conductivity-type horizontal MOSFET. A gate of the second-conductivity-type horizontal MOSFET is connected to the source of the first-conductivity-type horizontal MOSFET.

In the semiconductor device according to the above-mentioned aspect, a well diffusion region in which a channel layer of the first-conductivity-type horizontal MOSFET is formed and a well diffusion region in which a drain region of the second-conductivity-type horizontal MOSFET is formed may be a common diffusion region.

In the semiconductor device according to the above-mentioned aspect, a high-resistance region may be formed between a back gate contact region (p contact region 6a) and a source diffusion region (n source region 7c) of the first-conductivity-type horizontal MOSFET.

In the semiconductor device according to the above-mentioned aspect, the first-conductivity-type vertical MOSFET, the first-conductivity-type horizontal MOSFET, and the second-conductivity-type horizontal MOSFET may have substantially the same breakdown voltage.

In the semiconductor device according to the above-mentioned aspect, the first-conductivity-type vertical MOSFET may be a trench gate MOSFET.

In the semiconductor device according to the above-mentioned aspect, the second-conductivity-type horizontal MOSFET may be an enhancement-type MOSFET or a depression-type MOSFET.

According to the invention, MOSFETs to which a main current flows in a synchronous rectification circuit include a vertical MOSFET and horizontal MOSFETs with different conductivity types and the horizontal MOSFETs are connected in parallel to each other. Therefore, it is possible to reduce the current of a parasitic transistor provided in the horizontal MOSFET. Since the current of the parasitic transistor is reduced, it is possible to prevent the erroneous operation and breakdown of a semiconductor device.

BRIEF DESCRIPTION OF THE DRAWINGS

FIG. 1(a) is a cross-sectional view illustrating a main portion, and FIG. 1(b) is an equivalent circuit diagram;

FIG. 8(a) is an equivalent circuit diagram, and FIG. 8(b) is an I-V characteristic diagram;

FIG. 11(a) is a cross-sectional view illustrating a main portion, and FIG. 11(b) is an equivalent circuit diagram.

DETAILED DESCRIPTION

Figure 1:
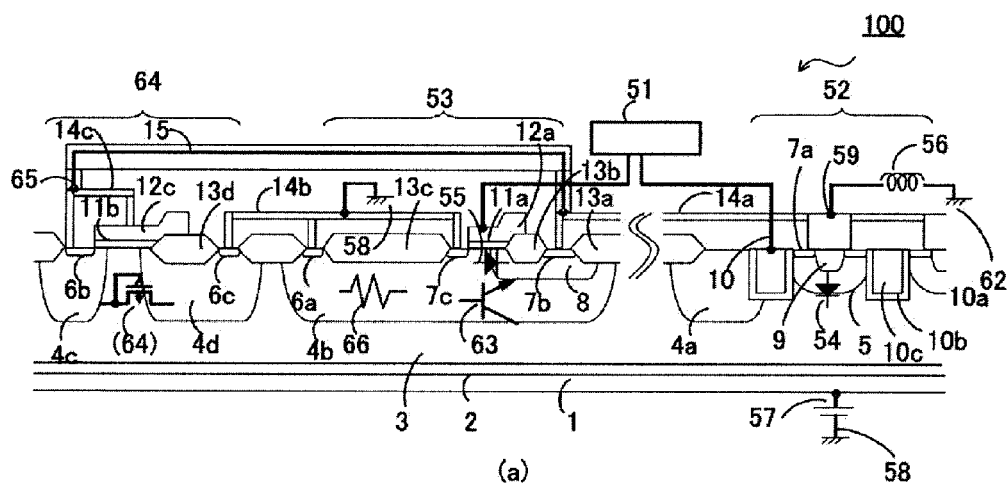
FIG. 1 is a diagram illustrating a semiconductor device 100 according to Example 1 of the invention.
Figure 1:
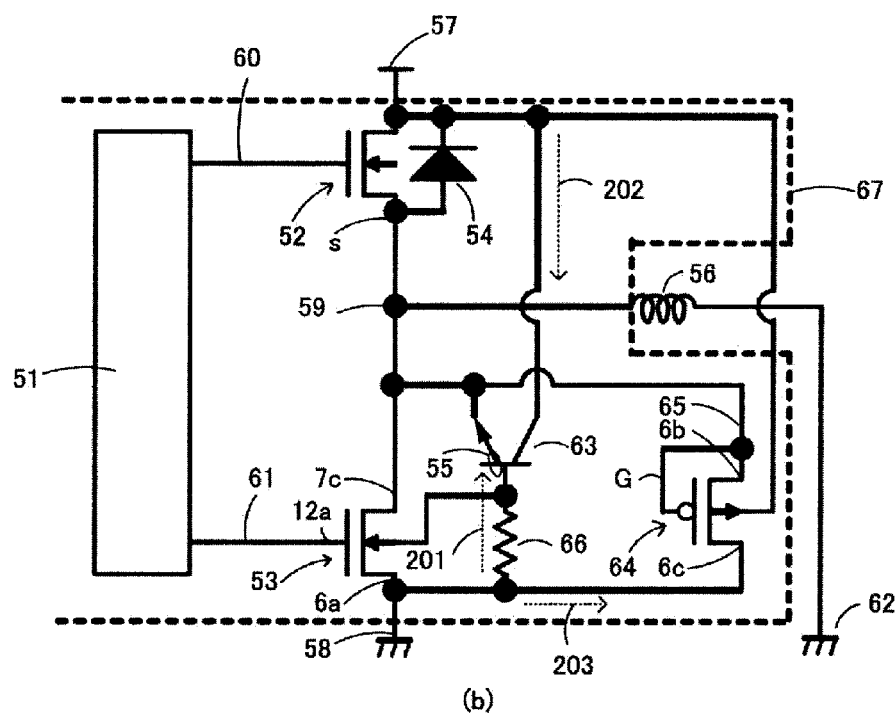

An embodiment will be described below using the following examples. In the following description, the same components as those in the related art are denoted by the same reference numerals. In the following examples, a first conductivity type is an n type and a second conductivity type is a p type. However, conversely, the first conductivity type may be a p type and the second conductivity type may be an n type. The following MOSFETs are an enhancement type as long as they are not described as a depression type.

Example 1

FIG. 1 is a diagram illustrating a semiconductor device 100 according to Example 1 of the invention. FIG. 1(a) is a cross-sectional view illustrating a main portion and FIG. 1(b) is an equivalent circuit diagram. In FIG. 1(b), a characteristic portion of the semiconductor device 100 according to Example 1 of the invention is represented by a dotted line 67. In Example 1, the semiconductor device 100 including a high-side vertical n-channel MOSFET (vertical n-channel MOSFET) 52, a low-side horizontal n-channel MOSFET (horizontal n-channel MOSFET) 53, and a low-side horizontal p-channel MOSFET (horizontal p-channel MOSFET) 64 which are mounted on a power IC will be described as an example.

In FIG. 1, a body diode 54, which is a parasitic diode, is formed in the vertical MOSFET 52. In FIG. 1, reference numerals 4c and 4d indicate p⁻ well diffusion regions.

Reference numerals 6b and 6c indicate a p source region and a p drain region which are p+ diffusion regions, respectively. Reference numeral 11b indicates a gate oxide film. Reference numeral 12c indicates a gate electrode. Reference numerals 13a, 13b, 13c, and 13d indicate LOCOS regions (LOCOS and LOCOS oxide films). Reference numerals 14a, 14b, 14c, and 15 indicate metal wires.

As illustrated in FIG. 1(a), in the semiconductor device 100, the vertical MOSFET 52 which is a high-side switch and the horizontal MOSFET 53 which is a low-side switch are formed on an n− epitaxial layer 3 which is formed on an n+ substrate 2. In the example illustrated in FIG. 1(a), the vertical MOSFET 52 is a trench gate MOSFET.

A control circuit 51 controls the vertical MOSFET 52 and the horizontal MOSFET 53. The control circuit 51 includes, for example, a horizontal MOSFET (not illustrated) and various types of passive elements (not illustrated) which are formed on the same semiconductor substrate. Reference numeral 54 indicates a body diode of the vertical MOSFET 52. Reference numeral 55 indicates a body diode of the horizontal MOSFET 53. Reference numeral 63 indicates a vertical parasitic transistor including the body diode 55 and the n− epitaxial layer 3.

Reference numerals 60 and 61 indicate the gates of the vertical MOSFET 52 and the horizontal MOSFET 53, respectively. The gates 60 and 61 of the vertical MOSFET 52 and the horizontal MOSFET 53 are connected to the control circuit 51. Reference numeral 56 indicates a linear solenoid. The linear solenoid 56 is connected to an output terminal 59 to which the source S of the vertical MOSFET 52 and the drain (n drain region 7b) of the horizontal MOSFET 53 are connected.

The horizontal MOSFET 64 is formed on the n epitaxial layer 3. The horizontal MOSFET 64 is a p-channel MOSFET and is turned off when a gate voltage increases. The source (p source region 6b) and gate G of the horizontal p-channel MOSFET 64 are electrically connected to a terminal 65. The terminal 65 of the horizontal MOSFET 64 is electrically connected to the output terminal 59. The drain (n drain region 6c) of the horizontal MOSFET 64 and the source (p source region 6a) of the horizontal MOSFET 53 are electrically connected to each other and are connected to a ground terminal 58. A power supply terminal 57 is connected to an external voltage source.

Next, the structure of the vertical MOSFET 52 will be described. An electrode 1 is formed on the rear surface of the n+ substrate 2. The electrode 1 serves as the drain of the vertical MOSFET 52. A gate oxide film 10b is formed in a trench 10a which is provided on the surface side of the n− epitaxial layer 3. The trench 10a (the gate oxide film 10b formed in the trench 10a) is filled with polysilicon and the polysilicon forms a gate electrode 10c which is connected to a gate terminal 10 of the vertical MOSFET 52.

The p body diffusion region 5 is formed so as to come into contact with the trench gate. An n source region 7a, which is an n+ diffusion region, and a p contact region 9, which is a second p+ diffusion region, are formed in the p body diffusion region 5. The n source region 7a and the p contact region 9 are electrically connected to each other by the metal wire 14a which is a metal film and serves as the source of the vertical MOSFET 52.

The surface of the p body diffusion region 5 which comes into contact with the trench gate is a channel region in which an inversion layer is formed. A p− well diffusion region 4a which has a concentration lower than the p body diffusion region 5 is formed in a termination portion of the trench gate. The p− well diffusion region 4a makes it possible to prevent a reduction in the breakdown voltage of the termination portion of the vertical MOSFET 52.

Next, the structure of the horizontal MOSFET 53 will be described. A p− well diffusion region 4b is formed in the n− epitaxial layer 3. An n drain region 7b, which is an n+ diffusion region, is formed in the p− well diffusion region 4b. The n drain region 7b is a drain contact region of the horizontal MOSFET 53.

In order to increase the breakdown voltage of the horizontal MOSFET 53, an n− offset diffusion region 8 is formed so as to surround the n drain region 7b and a LOCOS region 13b is formed. Therefore, the vertical MOSFET 52 and the horizontal MOSFET 53 have substantially the same breakdown voltage. An n source region 7c of the horizontal MOSFET 53 is an n+ diffusion region. A gate oxide film 11a is formed between a portion of the n− offset diffusion region 8 and the n source region 7c.

A gate electrode 12a of the horizontal MOSFET 53 which is made of polysilicon is formed on the gate oxide film 11a. The p contact region 6a which is a p+ diffusion region is formed as a back gate contact region in the p− well diffusion region 4b. The p contact region 6a is electrically connected to the n source region 7c by the metal wire 14b which is a metal film. The surface of the p− well diffusion region 4b which comes into contact with the gate oxide film 11a is a channel region in which an inversion layer is formed.

Next, the structure of the horizontal MOSFET 64 which is a p-channel MOSFET will be described. In the horizontal MOSFET 64, the p source region 6b which is a p+ diffusion region and the p− well diffusion region 4c which surrounds the p source region 6b are formed and serve as the source of the horizontal MOSFET 64. The p− well diffusion region 4c is formed in order to increase the breakdown voltage between the n+ substrate 2 and the p source region 6b. The p drain region 6c which is a p+ diffusion region is a drain contact region of the horizontal MOSFET 64.

The p− well diffusion region 4d and the LOCOS region 13d are formed so as to surround the p drain region 6c in order to increase the breakdown voltage of the horizontal MOSFET 64. The gate oxide film 11b is formed in portions of the surfaces of the p− well diffusion regions 4c and 4d and a portion of the surface of the n− epitaxial layer 3.

The gate electrode 12c of the horizontal MOSFET 64 which is made of polysilicon is formed on the gate oxide film 11b. The gate electrode 12c and the p source region 6b of the horizontal MOSFET 64 are electrically connected to the terminal 65 by the metal wire 14c which is a metal film. The terminal 65 is electrically connected to the output terminal 59 through the metal wires 15 and 14a which are a second metal film. The surface of the n− epitaxial layer 3 which comes into contact with the gate oxide film 11b is a channel region in which the inversion layer is formed.

In Example 1, the p− well diffusion regions 4a, 4b, 4c, and 4d are diffusion layers which are formed with the same concentration by the same process. However, the p− well diffusion regions 4a, 4b, 4c, and 4d may be formed by different processes and may have different concentrations. In Example 1, the gate oxide films 11a and 11b of the horizontal MOSFETs 53 and 64 are oxide films which are formed by the same process and have the same thickness. However, the gate oxide films 11a and 11b may be formed by different processes and may have different thicknesses.

Figure 2:
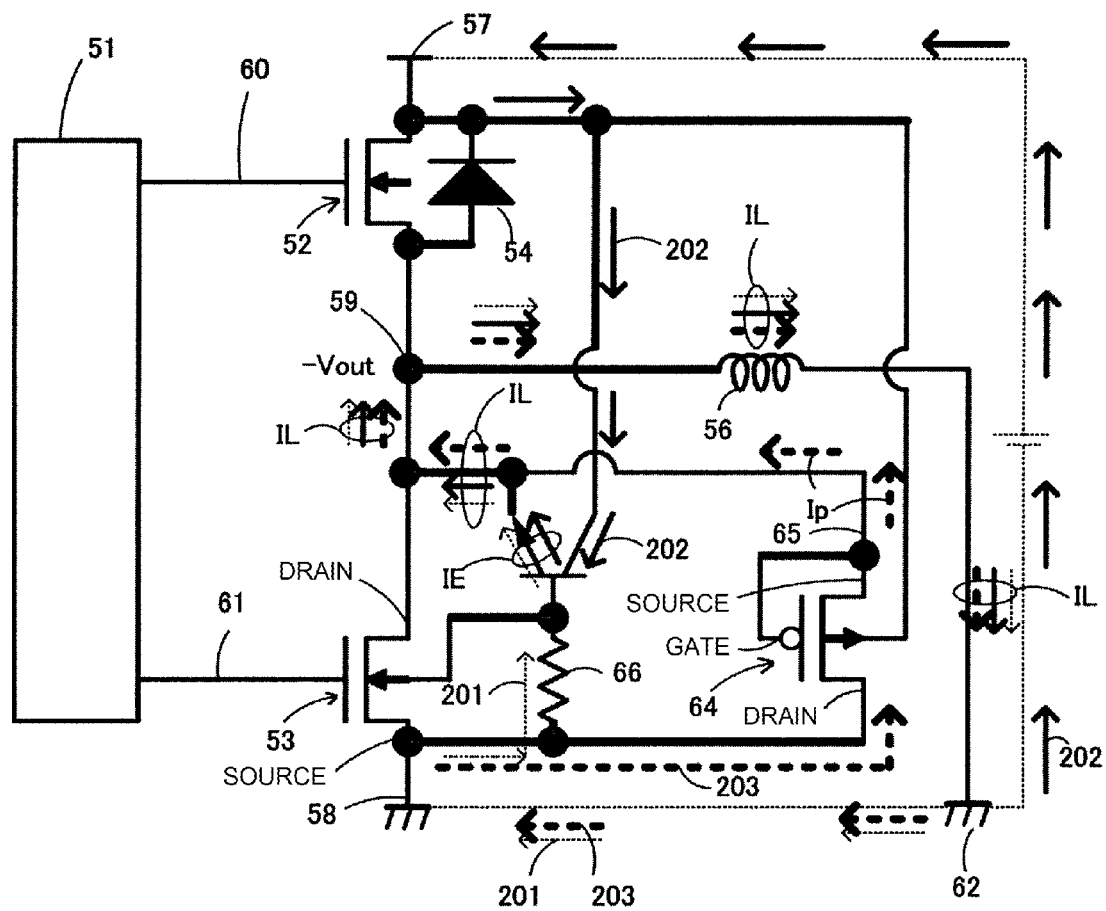
FIG. 2 is a diagram illustrating the operation of the semiconductor device 100 illustrated in FIG. 1.
Figure 10:
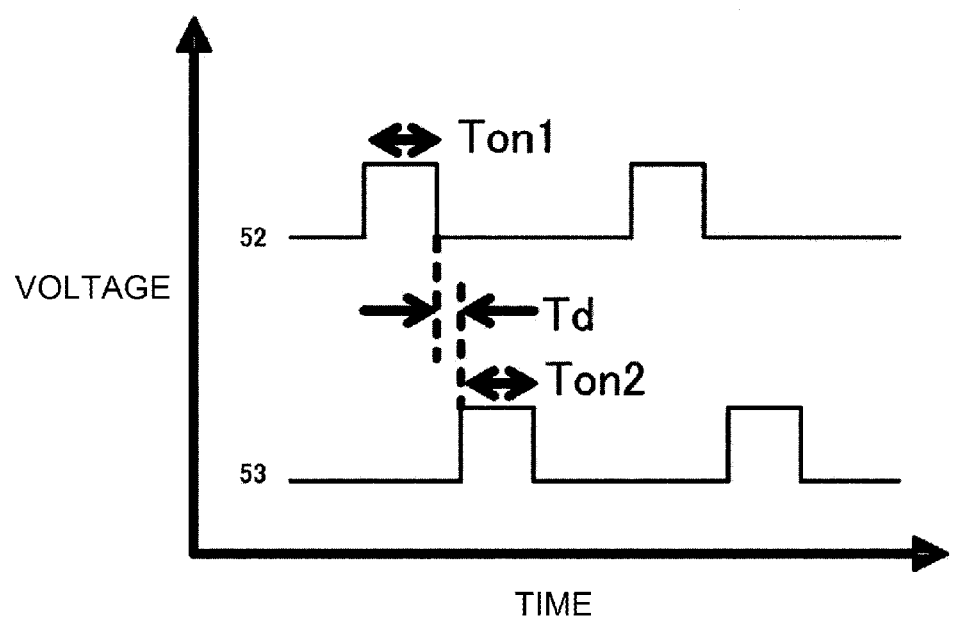
FIG. 10 is a timing chart illustrating output signals from a control circuit 51.
Figure 11:
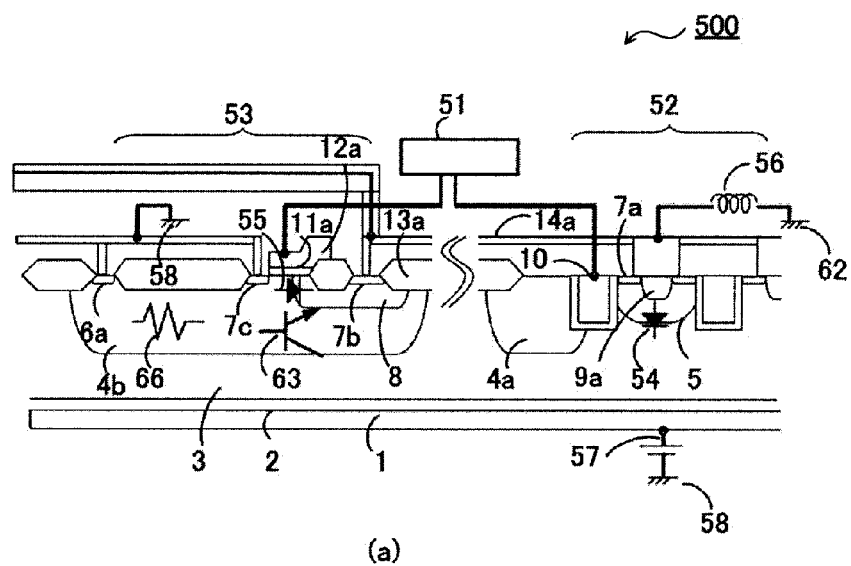
FIG. 11 is a diagram illustrating the synchronous-rectification-type power IC using a vertical MOSFET 52 and a horizontal MOSFET 53.
Figure 11:
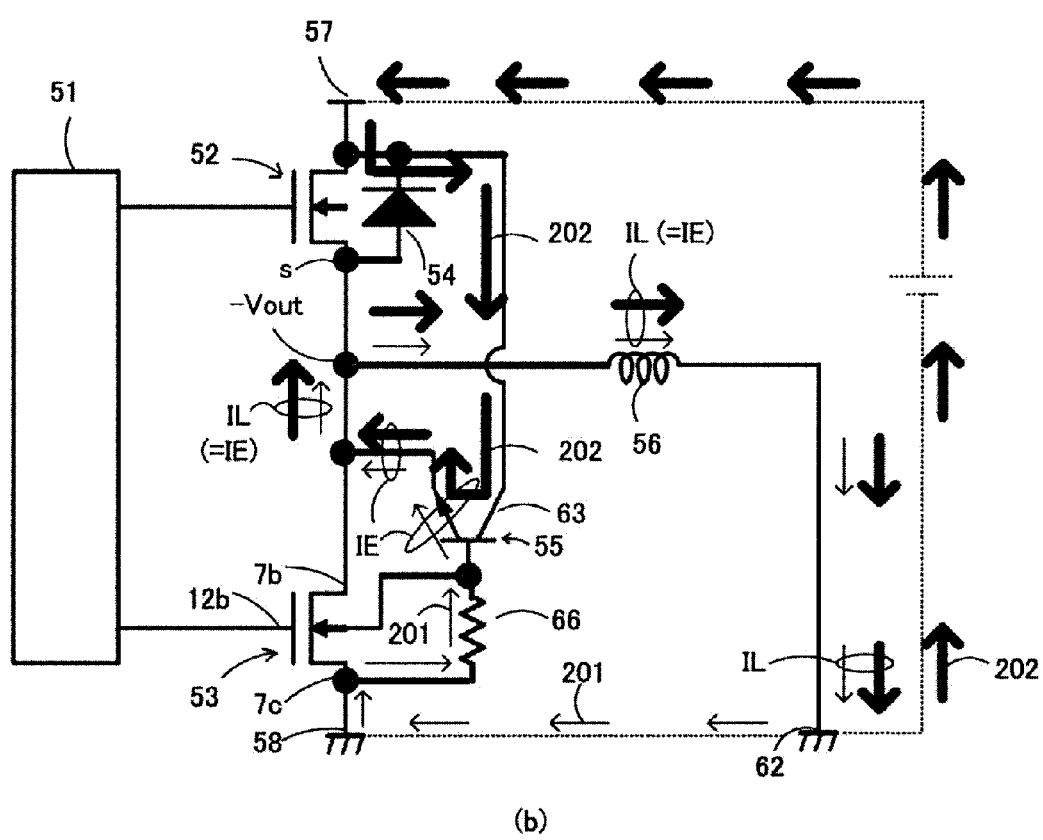
Figure 12:
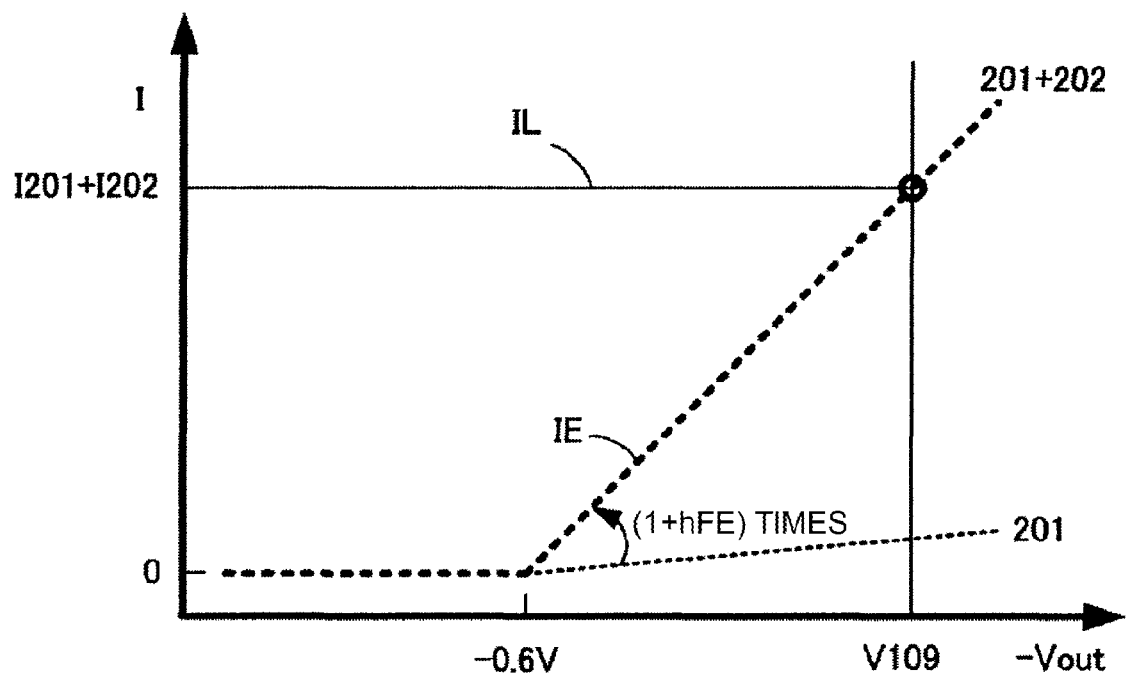
FIG. 12 is a diagram illustrating the I-V characteristics of a parasitic transistor 63.

Next, the operation of the semiconductor device 100 illustrated in FIG. 1 will be described. FIG. 2 is a diagram illustrating the operation of the semiconductor device 100 illustrated in FIG. 1. In FIG. 2, when the signal illustrated in FIG. 10 is input, for a period Ton1, the vertical MOSFET 52 is turned on, the horizontal MOSFET 53 is turned off, and the potential of the output terminal 59 increases to a power supply potential.

The horizontal p-channel MOSFET 64 connected between the output terminal 59 and the ground terminal 58 is turned off since the gate and the source (high potential side) are electrically connected to each other and a high voltage is applied to the gate. At that time, a positive power supply voltage is applied between the drain and source of the horizontal MOSFET 53. In addition, a negative voltage is applied to the drain and a positive voltage (forward voltage) is applied to the source in the horizontal MOSFET 64. Since the source and the gate are short-circuited, a channel is closed and the horizontal MOSFET 64 is turned off. That is, since both the MOSFETs 53 and 64 are designed so as to have an off breakdown voltage equal to or greater than the power supply voltage, a breakdown current does not flow.

For a dead time period Td, the vertical MOSFET 52 is turned off and the potential of the output terminal 59 is lower than that of the ground terminal 58 by the electromotive force of the linear solenoid 56. At that time, a positive voltage is applied between the drain and source of the MOSFET 64, the potential of the ground terminal 58 is applied to the drain, and the potential of the output terminal 59 that is lower than the ground potential is applied to the source.

Therefore, the gate potential is lower than the drain potential. In addition, the back gate region of the horizontal MOSFET 64 is the n⁻ epitaxial layer 3 and has a higher power supply potential than the p source region 6b. Therefore, the back gate region which faces the gate electrode 12c with the gate oxide film interposed therebetween is depleted and has a higher potential than the gate electrode 12c. As a result, a p channel is opened, the horizontal MOSFET 64 is turned on, and a current 203 flows from the drain to the source.

Since the source and gate of the horizontal MOSFET 64 are electrically connected to each other (short-circuited), a negative voltage is applied to the gate and the inversion layer is formed on the surface of the n⁻ epitaxial layer 3 below the gate. Therefore, the current 203 flows in a direction from the drain to the source. At the same time, a current 201 flows to the body diode 55.

The current 201 which flows to the body diode 55 is a base current of the parasitic transistor 63. A current that is hFE times more than the base current (=the body diode current 201) flows as a collector current 202 to the parasitic transistor 63. This current is (1+hFE) times more than the current 201 of the body diode 55 as an emitter current IE. Therefore, the sum of the current 203 of the horizontal MOSFET 64, the current 201 of the body diode, and the collector current 202 of the parasitic transistor 63 flows as a return current IL to the linear solenoid 56.

As a result, the current 201 and the current 202 which flow to the parasitic transistor 63 are reduced by the current 203 which flows to the horizontal MOSFET 64. Therefore, the loss of the parasitic transistor 63 is reduced and the breakdown of the semiconductor device 100 due to the generation of heat is prevented. However, the sum of the base current (=the current 201) of the parasitic transistor 63 and the collector current 202 is the emitter current IE. A current obtained by adding the current 203 to the emitter current IE is the return current IL which flows to the linear solenoid 56.

For the dead time period Td, the back gate region of the horizontal MOSFET 64 is the n⁻ epitaxial layer 3 and has a higher power supply potential than the p source region 6b. Therefore, the body diode of the horizontal MOSFET 64 formed by the p⁻ well diffusion region 4c and the n⁻ epitaxial layer 3 is reversely biased and no current flows. That is, there is no body diode current which flows from the n⁻ epitaxial layer 3 to the p source region 6b.

Next, a period Ton2 will be described. For the period Ton2, the horizontal MOSFET 53 is turned on and the return current IL flows through a channel portion of the horizontal MOSFET 53. Therefore, the current 203 which flows to the horizontal MOSFET 64, the current 201 which flows to the body diode 55, and the collector current 202 of the parasitic transistor 63 are replaced with a current which flows through the channel of the horizontal MOSFET 53.

Figure 3:
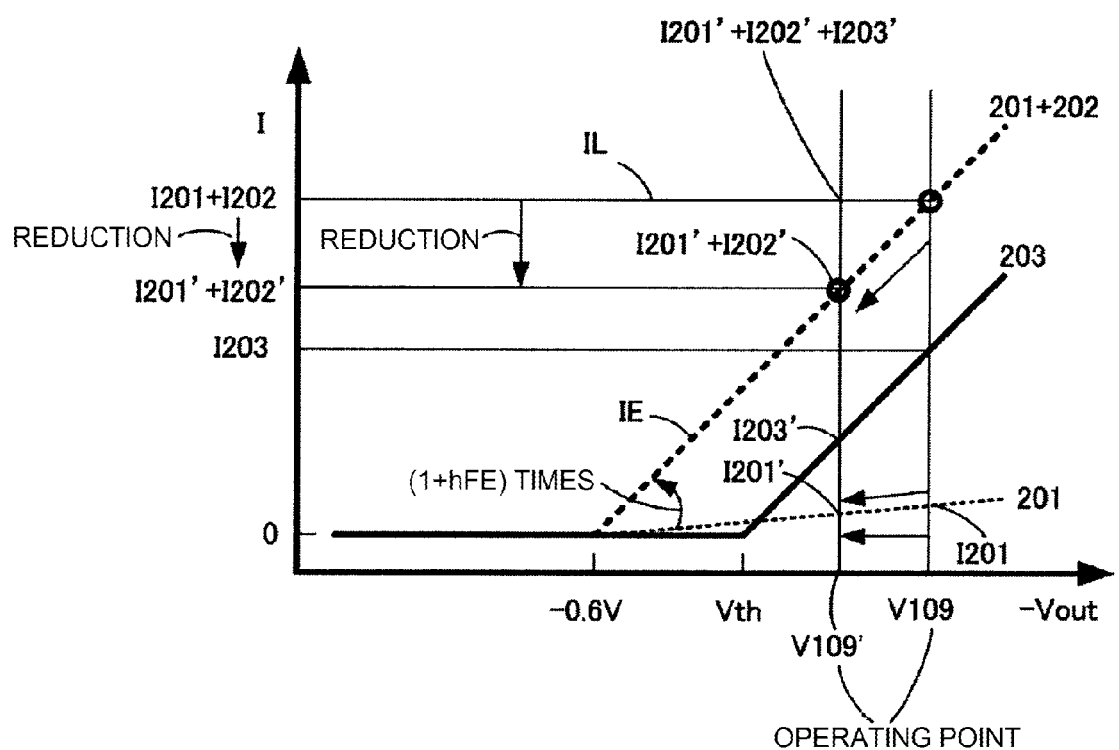
FIG. 3 is a diagram illustrating an example of the I-V waveforms of a horizontal MOSFET 64 and a parasitic transistor 63 including a body diode 55 which are connected as illustrated in FIG. 1.

FIG. 3 is a diagram illustrating an example of the I-V waveforms of the horizontal MOSFET 64 and the parasitic transistor 63 including the body diode 55 which are connected as illustrated in FIG. 1. In the related art in which the horizontal MOSFET 64 is not connected, when the voltage V109 of the output terminal 59 is applied to the body diode 55 during the dead time period Td, a current value I201 flows to the body diode 55. Since the current value I201 is the base current value of the parasitic transistor 63, a current that is hFE times more than the base current value flows as a collector current value I202 to the collector of the parasitic transistor 63. The sum of the current values I201 and I202 flows as the return current IL to the linear solenoid 56.

In contrast, in Example 1 of the invention in which the horizontal p-channel MOSFET 64 is connected, the current value which flows to the linear solenoid 56 is equal to a current value I201+I202. When the value of the current 203 which flows to the horizontal MOSFET 64 is I203', the value of the current 201 which flows to the body diode 55 is I201', and the value of the collector current 202 of the parasitic transistor 63 is I202', V109 which is an operating point moves to V109' such that a current value I201'+I202'+I203' which is the sum of the current values is equal to the current value I201+I202. As a result, IL=I201+I202=I201'+I202'+I203' is established. Then, the current value I201+I202 is reduced to I201'+I202'. Since the current which flows to the parasitic transistor 63 is reduced as described above, the loss of the parasitic transistor 63 is reduced and it is possible to prevent the erroneous operation or breakdown of the semiconductor device 100.

Figure 4:
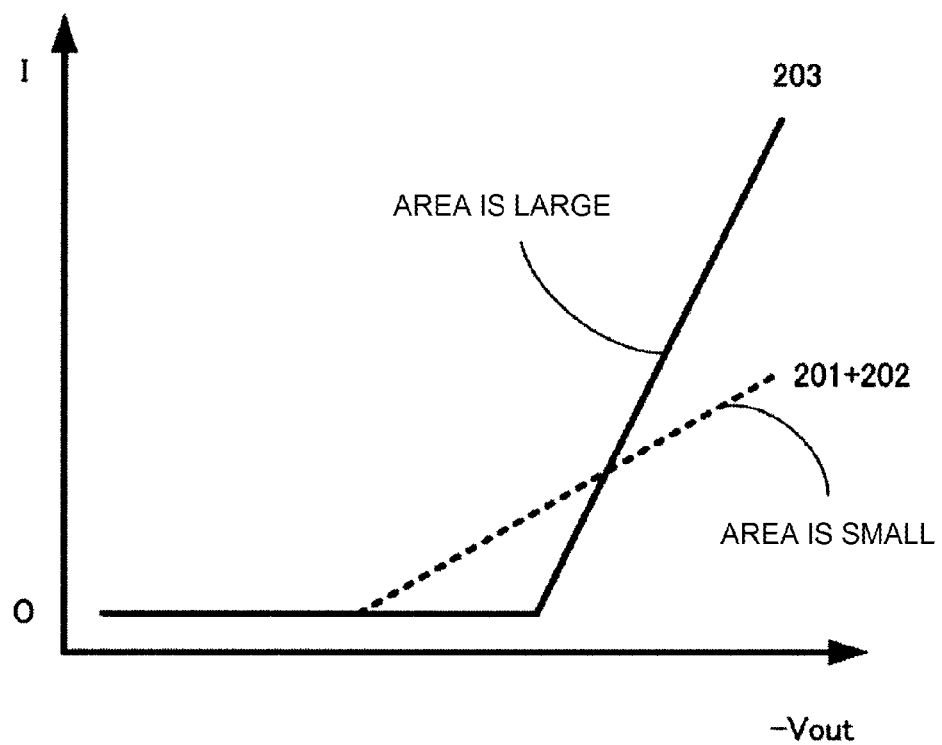
FIG. 4 is a diagram illustrating another example of the I-V waveforms of the horizontal MOSFET 64 and the parasitic transistor 63 including the body diode 55.

FIG. 4 is a diagram illustrating another example of the I-V waveforms of the horizontal MOSFET 64 and the parasitic transistor 63 including the body diode 55. FIG. 4 illustrates another example of the I-V waveforms of the horizontal MOSFET 64 and the parasitic transistor 63 including the body diode 55 in a case in which the chip size of the horizontal MOSFET 53 increases to increase a resistance component of the body diode 55 and the chip size of the horizontal MOSFET 64 increases to increase current driving capability, as compared to FIG. 3.

In this case, the current 203 which flows to the horizontal MOSFET 63 increases and the current 201 of the body diode 55 decreases, as compared to FIG. 3. As a result, the collector current 202 of the parasitic transistor 63 decreases and it is possible to reduce the loss of the parasitic transistor 63 and to prevent the erroneous operation or breakdown of the semiconductor device 100.

The horizontal MOSFET 64 has a function of reducing the current 201 (the base current of the parasitic transistor 63) which flows to the body diode 55 and reducing the collector current 202 of the parasitic transistor 63 only for the dead time period Td, without having any effect on the operation during the periods Ton1 and Ton2. In Example 1, since the synchronous rectification circuit is formed by one chip, it is possible to reduce the size and costs of the system.

Example 2

Figure 5:
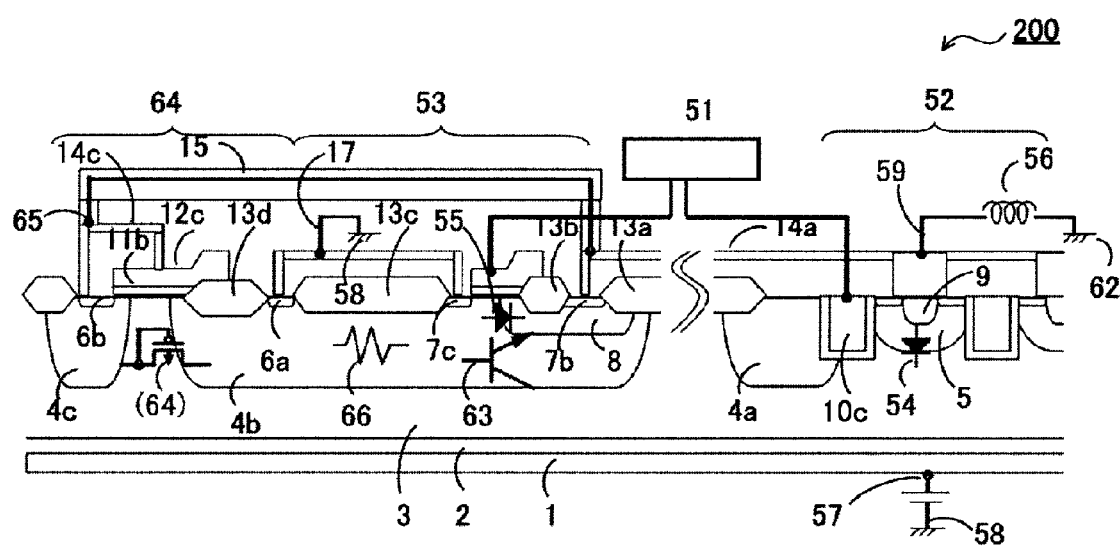
FIG. 5 is a cross-sectional view illustrating a main portion of a semiconductor device 200 according to Example 2 of the invention.

FIG. 5 is a cross-sectional view illustrating a main portion of a semiconductor device 200 according to Example 2 of the invention. The semiconductor device 200 differs from the semiconductor device illustrated in FIG. 1 in that the p⁻ well diffusion region 4d and the p drain region 6c of the horizontal MOSFET 64 and the p⁻ well diffusion region 4b and the p contact region 6a of the horizontal MOSFET 53 illustrated in FIG. 1 are integrated, respectively. According to the integration, the total area of the horizontal MOSFETs 53 and 54 can be less than that in the semiconductor device 100 illustrated in FIG. 1 and it is possible to reduce the chip costs of the semiconductor device 200.

Figure 6:
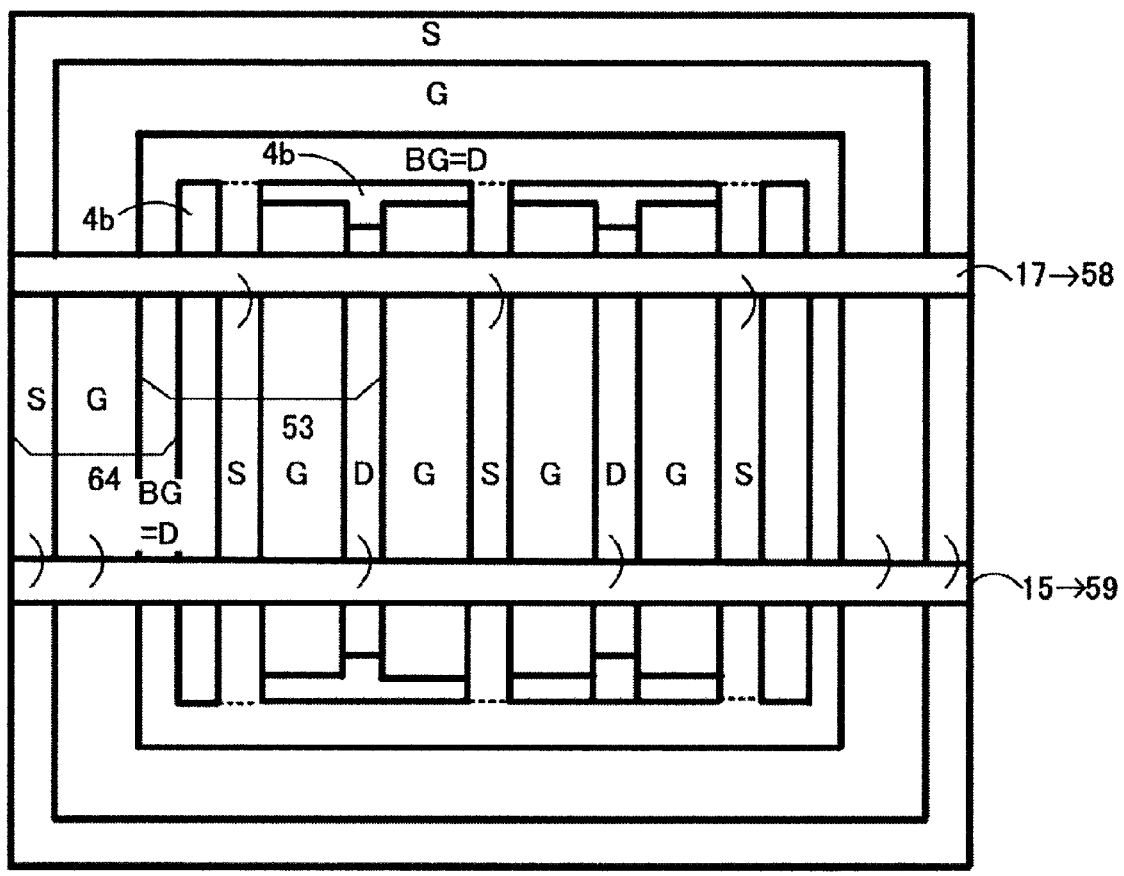
FIG. 6 is a diagram illustrating the planar layout of a horizontal MOSFET 64 and a horizontal MOSFET 53 which are provided in the semiconductor device 200 according to Example 2 of the invention illustrated in FIG. 5.

FIG. 6 is a diagram illustrating the planar layout of a horizontal MOSFET 64 and a horizontal MOSFET 53 provided in the semiconductor device 200 according to Example 2 of the invention illustrated in FIG. 5. FIG. 6 illustrates an example of the planar layout of the horizontal MOSFET 64 and the horizontal MOSFET 53 provided in the semiconductor device 200 according to Example 2 of the invention. In FIG. 6, a back gate contact region (which is a p contact region 6a and also functions as the p drain region 6c illustrated in FIG. 1) is formed so as to surround the horizontal MOSFET 53 in which a drain and a source are arranged in a multi-finger structure.

The horizontal MOSFET 64 has the back gate contact region as a p drain region and is arranged in the outer circumference of the back gate contact region. The regions are connected to each other by second metal wires (metal wires 15 and 17). In FIG. 6, letter S indicates a source electrode, letter G indicates a gate electrode, letter D indicates a drain electrode, and letters BG indicate a contact electrode which is connected to the back gate contact region.

In the semiconductor device 200 according to Example 2 of the invention, the use of the above-mentioned structure and the second metal wires (metal wires 15 and 17) makes it possible to suppress an increase in area and to achieve the horizontal MOSFET 53 and the horizontal MOSFET 64 illustrated in FIG. 5.

Example 3

Figure 7:
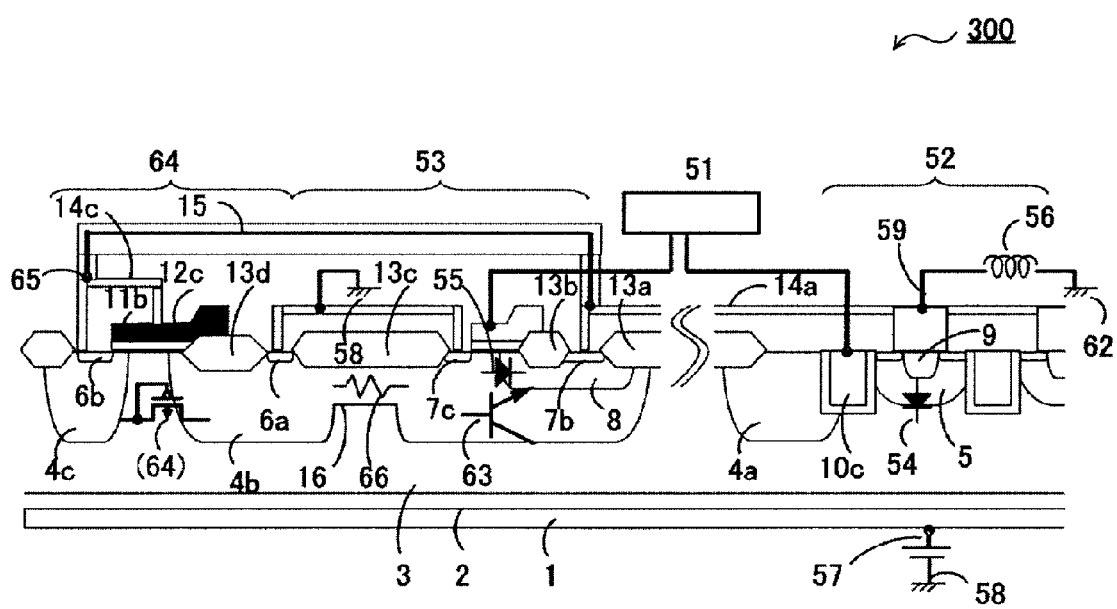
FIG. 7 is a cross-sectional view illustrating a main portion of a semiconductor device 300 according to Example 3 of the invention.

FIG. 7 is a cross-sectional view illustrating a main portion of a semiconductor device 300 according to Example 3 of the invention. The semiconductor device 300 differs from the semiconductor device illustrated in FIG. 5 in that a p⁻ well diffusion region 16 is interposed between the back gate contact region (p contact region 6a) of the horizontal MOSFET 53 and the n source region 7c of the horizontal MOSFET 53 to increase resistance 66. The current 201 of the body diode 55 and the collector current 202 of the parasitic transistor 63 are suppressed by the resistance component 66. As a result, it is easy to achieve the I-V characteristics having the relation illustrated in FIG. 4 and it is possible to effectively prevent the erroneous operation or breakdown of the device.

In the invention, FIGS. 1, 5, and 7 illustrate the example in which the trench gate MOSFET is applied as the vertical MOSFET 52. However, the vertical MOSFET 52 may be a planar gate MOSFET. Since the trench-gate vertical MOSFET 52 has a lower on-resistance per unit area than the planar gate MOSFET, it is effective in reducing a chip area and chip costs. In the invention, the planar-gate horizontal MOSFETs are applied as the horizontal MOSFETs 53 and 64. However, the horizontal MOSFETs 53 and 64 may be trench-gate horizontal MOSFETs. This case is effective in further reducing the chip area and the chip costs, as compared to the structures illustrated in FIGS. 1, 5, and 7.

Example 4

Figure 8:
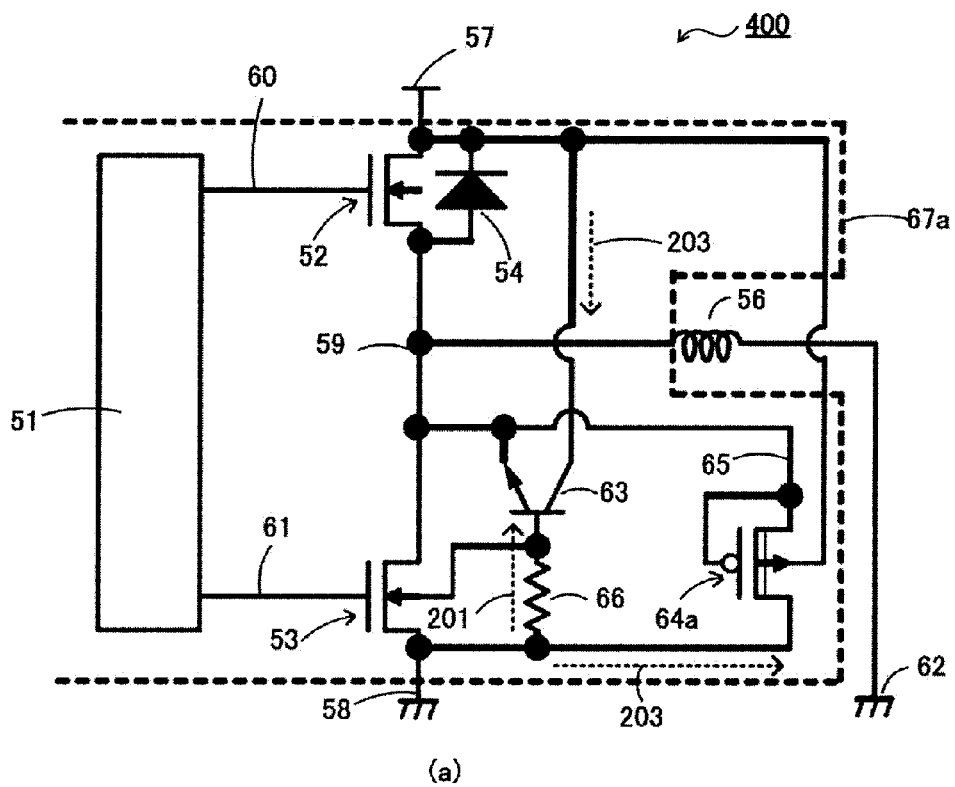
FIG. 8 is a diagram illustrating a semiconductor device 400 according to Example 4 of the invention.
Figure 8:
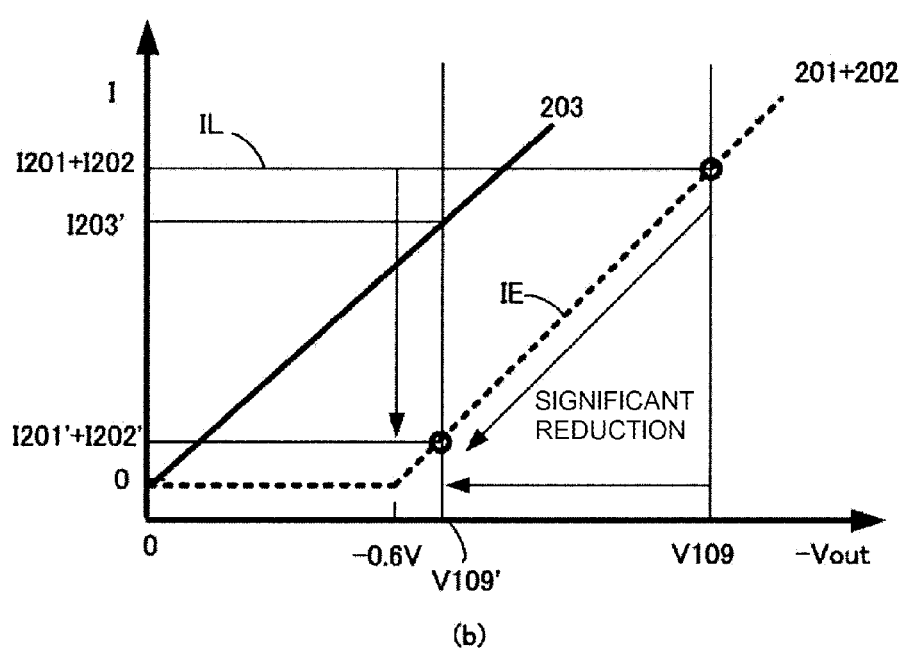
Figure 9:
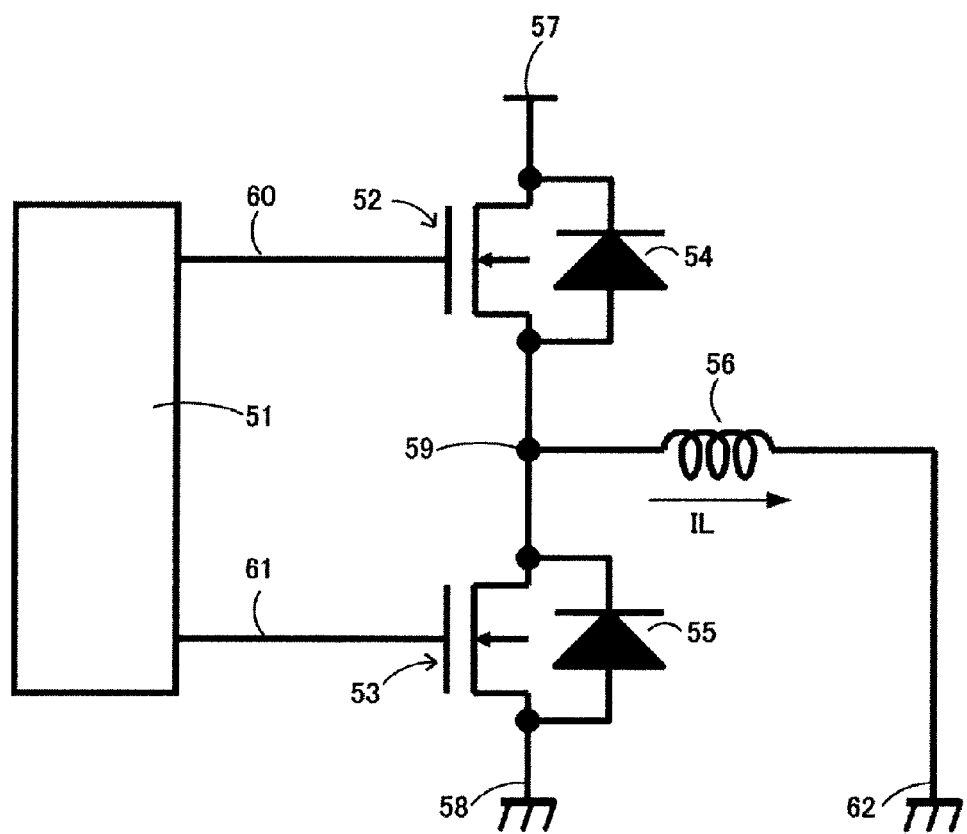
FIG. 9 is a circuit diagram illustrating a synchronous-rectification-type linear solenoid driving system.

FIG. 8 is a diagram illustrating a semiconductor device 400 according to Example 4 of the invention. FIG. 8(a) is an equivalent circuit diagram and FIG. 8(b) is an I-V characteristic diagram. Example 4 differs from Examples 1 to 3 in that a depression-type horizontal p-channel MOSFET 64a replaces the enhancement-type horizontal p-channel MOSFET 64. Example 4 has a greater effect than the above-mentioned example. A dotted line 67a indicates the range of the semiconductor device 400.

As illustrated in FIG. 8(b), an operation voltage is significantly reduced from V109 to V109' and most of the return current IL flows to the depression-type horizontal p-channel MOSFET 64a and becomes a current 203'. Therefore, the values I201' and I202' of the currents 201 and 202 which flow to the parasitic transistor 63 are significantly reduced.

EXPLANATIONS OF LETTERS OR NUMERALS

1 REAR SURFACE ELECTRODE
2 n⁺ SUBSTRATE
3 n⁻ EPITAXIAL LAYER
4a, 4b, 4c, 4d, 16 p⁻ WELL DIFFUSION REGION
6b p SOURCE REGION
6c p DRAIN REGION
7b n DRAIN REGION
7c n SOURCE REGION
8 n⁻ OFFSET DIFFUSION REGION
10c, 12a, 12c, G GATE ELECTRODE
13a, 13b, 13c, 13d LOCOS REGION
14a, 14b, 14c, 15, 17 METAL WIRE
51 CONTROL CIRCUIT
52 VERTICAL MOSFET (n CHANNEL TYPE)
53 HORIZONTAL MOSFET (n CHANNEL TYPE)
55 BODY DIODE
56 LINEAR SOLENOID
57 POWER SUPPLY TERMINAL
58, 62 GROUND TERMINAL
59 OUTPUT TERMINAL
63 PARASITIC TRANSISTOR
61 HORIZONTAL MOSFET (p CHANNEL TYPE)
64a HORIZONTAL MOSFET (DEPRESSION-TYPE p CHANNEL)
66 RESISTANCE
100, 200, 300 SEMICONDUCTOR DEVICE
201, 202, 203 CURRENT
I201, I202, I203 CURRENT VALUE
S SOURCE ELECTRODE
D DRAIN ELECTRODE
IL RETURN CURRENT

What is claimed is:
1. A semiconductor device comprising:
a semiconductor substrate;
a first-conductivity-type vertical MOSFET;
a first-conductivity-type horizontal MOSFET;
a circuit that controls the first-conductivity-type vertical MOSFET and the first-conductivity-type horizontal MOSFET; and
a second-conductivity-type horizontal MOSFET,
wherein the first-conductivity-type vertical MOSFET, the first-conductivity-type horizontal MOSFET, and the circuit are formed on the semiconductor substrate, a drain of the first-conductivity-type vertical MOSFET is connected to a power supply terminal, a source of the first-conductivity-type horizontal MOSFET is connected to a ground terminal, a source of the first-conductivity-type vertical MOSFET and a drain of the first-conductivity-type horizontal MOSFET are connected to an output terminal to form a synchronous rectification circuit, the second-conductivity-type horizontal MOSFET is connected in parallel to the first-conductivity-type horizontal MOSFET between the output terminal and the ground terminal, a drain of the second-conductivity-type horizontal MOSFET is connected to the source of the first-conductivity-type horizontal MOSFET, a back gate of the second-conductivity-type horizontal MOSFET has a potential that is different from a potential of the source of the first-conductivity-type horizontal MOSFET, a gate of the second-conductivity-type horizontal MOSFET is connected to the drain of the first-conductivity-type horizontal MOSFET, and a gate of the second-conductivity-type horizontal MOSFET is connected to a source of the second-conductivity-type horizontal MOSFET.

2. The semiconductor device according to claim 1, wherein a well diffusion region in which a channel layer of the first-conductivity-type horizontal MOSFET is formed and a well diffusion region in which a drain region of the second-conductivity-type horizontal MOSFET is formed are a common diffusion region.

3. The semiconductor device according to claim 2, wherein the second-conductivity-type horizontal MOSFET is an enhancement-type MOSFET or a depression-type MOSFET.

4. The semiconductor device according to claim 1, wherein a high-resistance region is formed between a back gate contact region and a source diffusion region of the first-conductivity-type horizontal MOSFET.

5. The semiconductor device according to claim 3, wherein the second-conductivity-type horizontal MOSFET is an enhancement-type MOSFET or a depression-type MOSFET.

6. The semiconductor device according to claim 1, wherein the second-conductivity-type horizontal MOSFET is an enhancement-type MOSFET or a depression-type MOSFET.

7. The semiconductor device according to claim 1, wherein the first-conductivity-type vertical MOSFET, the first-conductivity-type horizontal MOSFET, and the second-conductivity-type horizontal MOSFET have substantially a same breakdown voltage.

8. The semiconductor device according to claim 7, wherein the second-conductivity-type horizontal MOSFET is an enhancement-type MOSFET or a depression-type MOSFET.

9. The semiconductor device according to claim 1, wherein the first-conductivity-type vertical MOSFET is a trench gate MOSFET.

10. The semiconductor device according to claim 9, wherein the second-conductivity-type horizontal MOSFET is an enhancement-type MOSFET or a depression-type MOSFET.

11. The semiconductor device according to claim 1, wherein the second-conductivity-type horizontal MOSFET is turned on during a dead time period, the dead time period being set between a first condition in which the first-conductivity-type vertical MOSFET is turned on and the first-conductivity-type horizontal MOSFET is turned off and a second condition in which the first-conductivity-type vertical MOSFET and the first-conductivity-type horizontal MOSFET are turned on.

12. The semiconductor device of claim 1, wherein each of the first-conductivity-type horizontal MOSFET and the second-conductivity-type horizontal MOSFET has an off breakdown voltage equal to or greater than a power supply voltage.

13. The semiconductor device of claim 1, wherein the first-conductivity-type horizontal MOSFET and the second-conductivity-type horizontal MOSFET are formed in a same epitaxial layer on the semiconductor substrate.

14. The semiconductor device of claim 13, wherein a source of the first-conductivity-type horizontal MOSFET is connected to a drain of the second-conductivity-type horizontal MOSFET.

* * * * *